United States Patent [19]

Strandjord et al.

[11] Patent Number: 4,994,352
[45] Date of Patent: Feb. 19, 1991

[54] DYE-ENHANCED DEPOSITION OF ELEMENTAL METALS AND METALLOIDS ON SUBSTRATES

[75] Inventors: Andrew J. G. Strandjord; Michael S. Paquette; Syamalarao Evani; Ronald L. Yates; Mark D. Newsham, all of Midland, Mich.

[73] Assignee: The Dow Chemical Company, Midland, Mich.

[21] Appl. No.: 471,583

[22] Filed: Jan. 29, 1990

Related U.S. Application Data

[63] Continuation-in-part of Ser. No. 276,005, Nov. 25, 1988, abandoned.

[51] Int. Cl.5 .................. G03C 1/492; G03C 1/00; B32B 3/02
[52] U.S. Cl. .................................. 430/495; 430/494; 430/270; 430/945; 428/64; 346/135.1
[58] Field of Search .............. 430/494, 495, 945, 270, 430/346; 428/64; 346/135.1

[56] References Cited

U.S. PATENT DOCUMENTS

| | | | |
|---|---|---|---|
| 3,451,813 | 10/1967 | Kinney et al. | 96/36.2 |
| 4,230,939 | 10/1980 | deBont et al. | 346/76 L |
| 4,262,040 | 4/1981 | Russo | 427/229 |
| 4,342,714 | 8/1982 | Gregg et al. | 264/81 |
| 4,526,807 | 7/1985 | Auerbach | 427/53.1 |
| 4,614,705 | 9/1986 | Umehara | 430/945 |
| 4,626,496 | 12/1986 | Sato et al. | 430/270 |
| 4,650,108 | 3/1987 | Gallagher | 228/124 |
| 4,707,430 | 11/1987 | Ozawa et al. | 430/270 |
| 4,735,839 | 4/1988 | Sato et al. | 428/64 |
| 4,735,889 | 4/1988 | Namba et al. | 430/273 |
| 4,767,693 | 8/1988 | Oba et al. | 430/270 |

Primary Examiner—Paul R. Michl
Assistant Examiner—Ashley Pezzner
Attorney, Agent, or Firm—Bruce M. Kanuch

[57] ABSTRACT

An article and method for its perparation is disclosed wherein the article comprises a substrate having at least one planar surface on which is disposed a thermally decomposable metallo-organic compound in active association with a photosensitive dye. The article can be easily processed with, for example, a source of energy such as a laser beam to encode information or produce electroconductive lines.

11 Claims, No Drawings

DYE-ENHANCED DEPOSITION OF ELEMENTAL METALS AND METALLOIDS ON SUBSTRATES

CROSS-REFERENCE TO RELATED APPLICATION

This application is a continuation-in-part of application Ser. No. 276,005 filed Nov. 25, 1988, now abandoned, the teachings of which are specifically incorporated herein by reference.

FIELD OF THE INVENTION

The present invention relates to the use of a thermally decomposable metallo-organic decomposition material admixed with a photosensitive dye, the mixture having improved sensitivity to heat induced reduction of the metal to form laser readable or electroconductive portions on a substrate. The invention is useful in optical memory and electronic applications such as in the manufacture of CD discs, printed circuit boards, prerecorded audio and video discs, connections to electronic chips, semiconductive layers and the like.

BACKGROUND OF THE INVENTION

An increasingly complex information-based society has generated the need for data storage media which offer high capacity, fast access and low cost. Optical memory media can potentially offer these advantages, however, the technology is not yet at an optimally developed stage. Researchers continue to discover new methods that reduce the cost and at the same time, improve the quality and storage capacity of optical media.

Optical memory media include discs, tapes and cards, among others. One embodiment of media is commonly referred to as a read-only memory (ROM). Data can be stored on ROM as extremely small structural relief features which are permanently molded onto the substrate surface. Subsequently, a reflective layer is adhered to the molded surface in order that the data can be read through differential reflection techniques.

Another embodiment of media is write-once-read-many (WORM), typically comprising one or more substrate layers and a recordable layer. Data is recorded on WORM by effecting an optically detectable change in the recordable layer using various techniques. These techniques include methods which cause a phase change, a topographical modification, a change in magneto-optical properties, a photochromism change, a bubble formation, or a selective ablation or melt (ablative/melt): Wen-yaung Lee, *Journal of Vacuum Technology* A3(3), pp 640-645 (1985).

The ablative/melt technique is the most commonly practiced method of recording data onto WORM media. Data is stored in the form of small pits or depressions in the surface of the recordable layer which are created by application of thermal energy, such as by using a focused beam of laser light. Exposure to laser light heats the exposed surface area to a threshold level at which point the layer melts and/or ablates away from the surface of the medium.

A layer suitable for recording using the ablative/melt technique commonly comprises an inorganic material such as a reflective metal. The thermo-sensitivity and conductivity properties of certain metals render them especially useful for laser light induced ablation. However, media which utilize a metallic recording layer, i.e., inorganic-based media, have disadvantages. The metallic layer is costly and difficulties are often encountered in depositing the metallic layer in a sufficiently uniform and secure manner on a substrate layer. Also, metallic layers are subject to environmentally induced chemical changes which may result in a change in optical properties.

In an effort to find an alternative to inorganic-based media, organics, especially polymers, have been used as a recordable layer. Organic-based media can be produced efficiently and are not as vulnerable to environmental attack as inorganic-based media. However, many polymeric recordable layers lack sufficient sensitivity to be of practical significance at the present time. In an effort to increase sensitivity to light energy, photosensitive dyes have been incorporated in organic-based media, i.e., dye-doped media. Organic dyes are chosen which exhibit high extinction coefficients near or at the output wavelength of incident laser light thus enhancing absorption of light energy. Unfortunately, high energy laser power, usually greater than 30 milliwatts (mWatts), is required to record data onto some of these dye-doped media.

Another recordable layer composition comprises a combination of organic and inorganic moieties. For example, Auerbach, U.S. Pat. No. 4,526,806, discloses a method of selectively depositing a pattern of reflective spots or lines of elemental metal or metalloid on a nonconductive substrate. As a layer containing a compound of the metal is exposed to high power laser light, the metal ion or metalloid compound dispersed in an oxidizable organic matrix is reduced to its metallic form.

It would be highly desirable to be able to produce an organic-based optical memory medium with improved sensitivity to laser light.

SUMMARY OF THE INVENTION

An article is provided comprising a solid substrate having adhered to at least one surface thereof an active layer comprising a thermally decomposable metallo-organic decomposition material in active association, such as an intimate mixture, with a photosensitive dye.

In one broad aspect, the invention is an optical memory medium comprising an active layer and at least one substrate layer, the active layer adhered to the substrate layer, wherein the active layer comprises a thermally decomposable metallo-organic decomposition material, in active association with a photosensitive dye.

Another broad aspect of the invention comprises an improvement in a method for preparing optical memory medium comprising the steps of (a) providing a substrate layer; having at least one planar surface (b) applying an adherent active layer of a thermally decomposable metallo-organic decomposition material in active association with a photosensitive dye to the planar surface of the substrate.

The optical memory medium of this invention and the method of preparation are applicable to and useful for any form of optical memory media known in the art, such as discs, tapes, cards and the like.

Another aspect of the present invention comprises an electronic circuitry medium comprising an active layer adhered to a nonelectroconductive substrate layer wherein the active layer comprises a thermally decomposable metallo-organic decomposition material in active association, such as an intimate mixture, with a photosensitive dye. Metallic lines comprising interconnections in microelectronic circuitry can be formed on the medium.

An additional aspect of the invention comprises a method of preparing an electroconductive medium comprising:

(a) providing a substrate layer;

(b) applying an adherent active layer of a thermally decomposable metallo-organic decomposition material which is in active association with a photosensitive dye to the substrate; and (c) exposing the film to a source of irradiation within the wavelength of 400 to 1100 nm to form electroconductive metallic lines on the medium wherein the metallic lines may serve as interconnections in microelectronic circuitry.

In its broadest aspect, the invention comprises a medium comprising a substrate and an active layer wherein the active layer comprises a thermally decomposable metallo-organic decomposition material in active association with a photosensitive dye, wherein the active layer is susceptible to formation of a pattern upon exposure to a source of irradiation.

"Active layer" as used herein means a recordable layer or film which undergoes an optically detectable change upon exposure to a source of thermal energy such as irradiation from a source of focused laser radiation.

"Ablation" as used herein means modification of the surface of the active layer resulting in structural, i.e., topographical changes, which are optically detectable.

"Photosensitive dye" as used herein means a material which is readily activated to form heat upon exposure to irradiation in the wavelength range which is not suitable to normally cause a direct reduction of the metal ion in the thermally decomposable metallo-organic decomposition material because of the low absorption of irradiation within that wavelength range. Activation within the wavelength range of 400 nm to 900 nm, preferably 500 to 900 nm to generate sufficient heat to cause a reduction in the metal ion contained in the thermally decomposable metallo-organic decomposition material is preferred.

DETAILED DESCRIPTION

The thermally decomposable metallo-organic decomposition material comprises an organic compound containing a heteroatom such as O, P, S, or N bridging a metal or metalloid ion to the organic group. The material can be an organic polymer referred to in the art as an ionomer or a lower molecular weight compound corresponding to the formula MXR wherein M is a metal or metalloid ion, X is a bridging atom selected from the group consisting of O, P, S, and N and R is a thermally decomposable organic group containing from 2 to 20 carbon atoms. The XR group can be selected from any organic group containing available O, P, S, or N linkage groups, e.g., amines, amides, mercaptides, mono or dibasic carboxylic acids, alkoxides, phosphines, and pyridine compounds. Preferred are carboxylic acids wherein the thermally decomposable metallo-organic decomposition material corresponds to the formula:

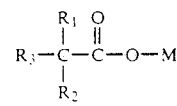

wherein $R_1$, $R_2$ and $R_3$ are independently H or aliphatic or aromatic groups such as alkyl, alkoxy, alkyl-thio, phenyl, hydroxyalkyl, hydroxyphenyl and the like, where the total carbon content of the $R_1$, $R_2$ and $R_3$ groups is from 2 to 14 carbon atoms.

Ionomers can also be employed as the thermally decomposable metallo-organic decomposition material. An ionomer is a metallic salt of a polymer. The polymer contains at least about two percent of the acidic pendant groups selected from the group consisting of $-COO^{-1}$, $-SO_3^{-1}$, $-PO_3^{-2}$, $-OPO_3^{-2}$ and combinations thereof. These ionomers when laid down on a substrate are susceptible to an optically detectable change upon exposure to a suitable source of thermal energy such as a focused laser radiation source. U.S. Pat. No. 3,939,242 discloses ionomers which when prepared using the metal or metalloids hereinafter disclosed can be used in the practice of this invention. The teachings of U.S. Pat. No. 3,939,242 are specifically incorporated herein by reference.

Ionomers which can be used in the active layer of the present invention can comprise a copolymer having repeating units of Formula I:

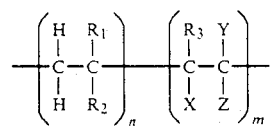

wherein:

$R_1$ is H, an aromatic group, an alkyl group having up to 22 carbons or phenyl;

$R_2$ is selected from the group consisting of H, $-CN$, $-OR_3$, halo, amide, a halogenated alkyl group, $-O-COR_3$, $-COR_3$, $-CH_2COOR_3$, $-COOR_3$, $-CON(R_3)_2$, an aromatic or aliphatic group having up to about 22 carbons and nitrogen containing derivatives thereof;

$R_3 = $ H or an aliphatic group having up to about 22 carbons;

$X = (-COO^{-1})M_a$, $(-SO_3^{-1})M_a$, $(-PO_3^{-2})M_a$ or $(-OPO_3^{-2})M_a$;

$Y = $ H, $-COOR_3$ or $(-COO^{-1})M_a$; and $Z = $ H, amide, $-CH_2COOR_3$ or $(-CH_2COO^{-1})M_a$;

wherein:

M is a metal or metalloid ion which in its elemental state is relatively stable to corrosion;

"a" is a number selected such that the positive valence of the metal or metalloid ion(s) equals the valence of the anionic species; and n and m are integers from at least 2 to about 1,000,000.

The copolymer, for example, can be formed from the polymerization of at least one vinyl monomer of the formula, $CH_2=CR_1R_2$, and at least one vinyl monomer of the formula, $CR_3X=CYZ$, wherein $R_1$, $R_2$, $R_3$, X, Y and Z are described above herein.

Exemplary $CH_2=CR_1R_2$ monomers include the higher alkyl esters of $\alpha,\beta$-ethylenically unsaturated carboxylic acids such as dodecyl acrylate, dodecyl methacrylate, tridecyl acrylate, tridecyl methacrylate, tetradecyl acrylate, tetradecyl methacrylate, octadecyl acrylate, octadecyl methacrylate alkyl half and full esters of anhydrides such as maleic anhydride; vinyl alkylates wherein the alkyl group has at least 8 carbons such as vinyl laurate and vinyl stearate vinyl alkyl ethers such as dodecyl vinyl ether and hexadecyl vinyl ether; N-vinyl amides such as N-vinyl lauramide and N-vinyl stearamide. Of the foregoing monomers, the alkyl esters of acrylic acid and methacrylic acid wherein the alkyl group has from about 8 to about 20 carbons are preferred. The alkyl methacrylates wherein the alkyl group has from 10 to about 20 carbons are more preferred.

Exemplary $CR_3X=CYZ$ monomers include ethylenically unsaturated amides such as acrylamide, methacrylamide and fumaramide; ethylenically unsaturated carboxylic acids such as acrylic acid, methacrylic acid, itaconic acid, crotonic and fumaric acid; aminoalkyl esters of unsaturated carboxylic acids such as 2-aminoethyl methacrylate. Of the foregoing monomers, ethylenically unsaturated acrylamide and acrylic acid are preferred.

The aforementioned polymers of Formula I are advantageously prepared by copolymerizing the monomers by any of the conventional copolymerization techniques; e.g., by solution, emulsion, suspension or precipitation.

Many metals and metalloids in their cationic state can be bound to the organic host to form the thermally decomposable metallo-organic decomposition material. A useful metal or metalloid ion comprises a cation of a metal selected from the group consisting of Cu, Ag, Au, Sn, Pb, In, Tl, Se, Te, Bi, Ni, Pd, Pt, Zn, Cd, Hg, Co, Rh, Ir, Fe, Ru, Os and mixtures thereof. Preferably, the metal ion is the cation of the metal selected from the group consisting of Cu, Ag, Au, Sn, Pb, Bi, Se, Te, Cd, Rh, Pd, Ir, Os, Pt and mixtures thereof. More preferably, the metal ion is the cation of the metal selected from the group consisting of Cu, Ag, Au, Pt, Pd and mixtures thereof.

It should be pointed out that not only does the ability of the thermally decomposable metallo-organic decomposition material to adsorb radiation energy within a certain wavelength range affect its reduction but also the electrochemical reduction potential of the metal cation influences this reduction. Thus the selection of any particular system will depend on the power of the radiation source to be used to reduce the metal in the active layer.

The thermally decomposable metallo-organic decomposition materials may be prepared by any of well known art methods. For example Formula I ionomers can be formed using a variety of techniques such as neutralization of the acid form of the polymer through the conventional acid-base reactions with an appropriate metal hydroxide. Another technique would be to exchange a metal ion of an alkali metal salt form or hydrogen form of the polymer film with an appropriate metal salt solution, e.g., a metal acetate. The simpler MXR materials can be prepared for example by converting a free carboxylic acid to the ammonium salt at room temperature in aqueous ammonium hydroxide followed by an ion exchange of the selected metal with ammonium ion.

A dye is selected which when combined with the thermally decomposable metallo-organic decomposition material serves as an organic chromophore that has a maximum absorption peak preferably in the wavelength range of about 500 nm to about 900 nm. There are a variety of acceptable dyes which meet this criterion. Preferably, the dye has a maximum absorption peak at a wavelength in a range from about 500 nm to about 900 nm, more preferably from about 780 nm to about 850 nm. In any event, the dye selected should have sufficient energy absorption properties in the wavelength region of the incident laser light to cause the thermally decomposable metallo-organic decomposition material to generate sufficient heat to undergo an optically detectable change upon exposure to a source of thermal energy. Even though some of the metallo-organic compounds are characterized by absorption within similar wavelengths the dye renders the material more sensitive and thus less energy is required to cause decomposition of the thermally decomposable metallo-organic decomposition material.

Among the dyes that are useful for the present invention are those found in Tables I through IV. Table I shows dyes having a maximum absorption peak in the wavelength range of about 500 nm to about 590 nm, Table II shows dyes having a maximum absorption peak from about 590 nm to about 750 nm, and Table III shows dyes having a maximum absorption peak from about 750 nm to about 900 nm. Table IV shows a list of dyes available from Eastman Kodak Corporation, Rochester, N.Y., which have maximum absorption peaks at various wavelengths between 400 nm and 900 nm. Depending on the desired stability of the particular medium to be made, dyes should be pretested together with the metallo-organic decomposition material for stability both with the metallo-organic decomposition material and the environment.

TABLE I

Dyes that have Maximum Absorption Peaks at Wavelengths of 500–590 nm

| Dye | Maximum Absorption Wavelength (nm) |
|---|---|
| 2',7'-Dichlorofluorescein | 512 |
| Rhodamine 110 (Eastman Kodak Co., Rochester, NY) | 510 |
| Rhodamine 116 (Eastman Kodak Co., Rochester, NY) | 512 |
| Rhodamine 116 (Eastman Kodak Co., Rochester, NY) | 511 |
| Oleosol Fast Black BL (Sumitomo Chemical Co., Tokyo, Japan) | 580 |
| Oleosol Fast Red BL (Sumitomo Chemical Co., Tokyo, Japan) | 520 |

TABLE II

Dyes that have Maximum Absorption Peaks at Wavelengths of 590–750 nm

| Dye | Maximum Absorption Wavelength (nm) |
|---|---|
| Aizen Spilon Blue GNH (Hodogaya Chemical Co., Tokyo, Japan) | 664 |
| Aizen Spilon Blue 2 GNH (Hodogaya Chemical Co., Tokyo, Japan) | 670 & 630 |
| Oil Color Black BY (Orient Chemical Co., Port Newark, NJ) | 590 |
| Oil Color Black HBB (Orient Chemical Co., Port Newark, NJ) | 600 |
| Oil Color Black #803 (Orient Chemical Co., Port Newark, NJ) | 645 & 595 |
| Oil Color Blue 603 (Orient Chemical Co., | 635 & 534 |

TABLE II-continued

Dyes that have Maximum Absorption Peaks at Wavelengths of 590-750 nm

| Dye | Maximum Absorption Wavelength (nm) |
|---|---|
| Port Newark, NJ) | |

TABLE III

Dyes that have Maximum Absorption Peaks at Wavelengths of 750-900 nm

| Dye | Maximum Absorption Wavelength (nm) |
|---|---|
| 3,3'-Diethylthiatricarbocyanine perchlorate | 773 |
| 1,1',3,3,3',3'-hexamethyl-4,4',5,5'-dibenzo-2,2'indocarbocyanine perchlorate | 782 |
| NDL-114 (Nippon Kanko Shikiso Co., Tokyo, Japan) | 800 |
| NK-125 (Nippon Kanko Shikiso Co., Tokyo, Japan) | 760 |
| PA-1002 (Mitsui Toatsu Chemicals Inc., Tokyo, Japan) | 895 |
| PA-1003 (Mitsui Toatsu Chemicals Inc., Tokyo, Japan) | 885 |

TABLE IV

Dyes Available from Eastman Kodak Corporation* Divided by Light Absorption Properties

| Maximum Absorption Wavelengths 400-500 nm | Maximum Absorption Wavelengths 500-600 nm | Maximum Absorption Wavelengths 600-700 nm | Maximum Absorption Wavelengths 800-900 nm |
|---|---|---|---|
| Coumarin 334 | 2,7-Dichlorofluoroescein | Oxazine 4 Perchlorate | IR-140 |
| Coumarin 343 | Rhodamine 6G Tetrafluoroborate | Oxazine 170 Perchlorate | IR-132 |
| Coumarin 6,7 | Rhodamine 6G | Nile Blue A Perchlorate | |
| Fluorescein | Rhodamine B | DTDC Iodide | |
| Rhodamine 10 | Sulforhodamine B | HITC Perchlorate | |
| | Sulforhodamine 101 | HITC Iodide | |
| | | IR-144 | |
| | | HDITC Perchlorate | |
| | | IR-125 | |

*Rochester, NY

The preferable dye is selected from the group consisting of oxoindolizines, naphthoquinones, cyanines, and mixtures thereof because of their combination of suitable stability and activation to laser light. Among the cyanines are phthalocyanines and metal phthalocyanines. The metal phthalocyanines are compounds of a phthalocyanine and a metal selected from the group consisting of Cu, Zn, V, Mo, Mn, Fe, Co, Ni, Pt, Be, Mg, Al, Ti, Sn, Pb, Pd, Pt and combinations thereof. Preferably the metal is Mn and V. A more preferable dye comprises 3,3'-di(3-acetoxypropyl-11-diphenylamino-10,12-ethylene-5,6,5',6'-dibenzothiatricarbocyanine perchlorate).

There are at least two ways in which the dye and the thermally decomposable metallo-organic decomposition material can be in active association with each other. In one way the dye and thermally decomposable metallo-organic decomposition material are combined into an intimate mixture. The mixture may be provided in a solvent and cast by any suitable method and cured to form a film with the dye trapped in the matrix. The dye and the thermally decomposable metallo-organic decomposition material can also be chosen such that upon mixing, the dye attaches to active sites on the thermally decomposable metallo-organic decomposition material such as on an ionomer backbone. Such active sites could comprise free ionic sites, or conceivably, the dye could replace some of the metal ions occupying those sites. In that event, the dye and thermally decomposable metallo-organic decomposition material, e.g., ionomer, should be of such character or concentration that when the dye and thermally decomposable metallo-organic decomposition material are mixed, the dye should not displace more than 70 percent of the bound metal ions and preferably not more than 50 percent. Sufficient dye should be mixed with the thermally decomposable metallo-organic decomposition material to assure that the resultant film as an active layer has an optical density from about 0.02 to about 10, preferably about 0.1 to about 10 at the wavelength of the incident laser light.

The thermally decomposable metallo-organic decomposition material is provided in any suitable solvent for application to the substrate. A wide variety of organic solvents may be used. Moreover the organic portion of the metallo-organic compound may be used as the solvent. Concentration of the thermally decomposable metallo-organic decomposition material in the solvent may vary over a wide range and are typically within the range of 0.05 to 10 percent, preferably 0.5 to 2 percent by weight.

Suitable solvents which can be employed include for example those which are suitable to dissolve the thermally decomposable metallo-organic decomposition material employed and which are easily removed from the substrate after laying down the thermally decomposable metallo-organic decomposition material film. For the ionomer metallo-organic decomposition materials, one of the monomeric materials may be employed as the solvent or other solvents or dispersants may be employed such as for example chloroform, carbon tetrachloride, petroleum ether, heptane, kerosene, benzene, toluene, nitro benzene, methanol, butanol, benzyl alcohol, acetone, methyl ethyl ketone, cyclohexanone, ethyl acetate, butyl acetate, ethyl ether, turpentine, terpineol, eugenol, cedrol, xylene, various terpenes such as pinene, dipentene and the like.

The initial mixture may also include additional materials to, for example, promote stability, control viscosity, or adhesion (e.g. tackifiers) and the like. Tackifiers include for example, rosin esters, e.g., methyl or glycerol ester of rosin, phthalates such as dioctyl phthalate and butyl phthalate and the like.

The optical medium may comprise a multilayer structure having one or more substrate layers and an active layer. A preferred medium comprises a two layer structure wherein one layer comprises a supporting substrate layer and the other layer is the active layer as defined herein adhered to one surface of the substrate as a film. The active layer can have a thickness of from about 2000 Å to about 100,000 Å, more preferably from about 5000 Å to about 20,000 Å. The substrate layer may have a thickness from about $1 \times 10^{-4}$ cm to about 1 cm. The active layer can be suitably protected by overcoating with a protective layer. The protective layer may be transparent, such as clear lacquer, i.e., a layer with minimal absorption of radiation in the wavelength region of the incident laser light. Protective overcoats may be organic or inorganic, such as for example, acrylics, polyurethanes, $SiO_2$, $TiO_2$, $MgF_2$, SiN, SiC and the like.

The substrate layer, may for example, be a resin selected from the group consisting of polycarbonate, polyvinyl halide, styrenics, polyvinylidene halide, epoxy, polyacrylate, polyester, polyimide, polyetherimide, and polyacetal, or may be a fiber-reinforced plastic, glass, ceramic, metal or composites thereof. Preferably the substrate layer is selected from the group consisting of a polymethylmethacrylate, polycarbonate, or polyester resin and glass.

The thermally decomposable metallo-organic decomposition material is, for example, dispersed in a suitable solvent and applied to the substrate in any suitable manner, as for example, by film casting techniques such as spin casting, spray casting or draw casting. After casting, the active layer can be cured through heat assisted air drying, photocuring or chemical curing. The resulting active layer should be thick enough so that upon subsequent laser writing, the optical density is sufficiently high to enable light energy from a laser to be absorbed and cause metallic lines or spots to be formed.

The optical medium construction, consisting of the combination of substrate and active layer may be in the form of a disc, tape, card or any other embodiment of optical memory such as for example those known in the art. The invention also is useful in electronic applications such as in the manufacture of printed circuit boards, prerecorded audio and video discs, connectors for electronic chips, semiconductive layers and the like. The preferred medium is a WORM medium.

Data or electroconductive lines are formed on the active layer by application of a source of irradiation energy which causes a reduction of the non-reflective metal cation to a reflective or other readable or electroconductive state, i.e., significantly more reflective, less reflective, transmissive or electroconductive than the surrounding unchanged area.

In a preferred embodiment of recording data onto the optical medium, a critically focused and controlled laser light beam is used to locally heat the active layer in a desired pattern or image to a critical temperature. The dye permits this to occur with less energy in a shorter period of time. It is theorized that the thermal energy promotes an electron transfer from the host organic material to the bound metal ion, thereby reducing it to a metallic or other state in the patterned or imaged areas. For example, the organic material is nonviolently oxidized and the metal is reduced. At the same time, the organic material in the exposed area is sufficiently degraded or ablated so as to render the reduced metal optically detectable. In an optical memory medium the resultant change of the active layer comprises a pattern of small reflective or less reflective spots, each the size of about ten microns or less, preferably about one micron or less. These spots comprise data which can be detected through differential reflection techniques using, e.g., a laser light beam of such energy which does not induce an optically detectable change in the active layer surface.

The laser light beam which is utilized to activate the reduction mechanism can have a wavelength in the range from about 400 nm to about 1100 nm, preferably from about 500 nm to about 900 nm, or a range of wavelengths of light commonly emitted by a diode laser. The wavelength of light emitted by the laser is chosen such that at a given concentration of a dye in the dye-doped medium, a sufficient amount of energy is delivered and absorbed in order to effect a reduction of the metal or other readable change in the thermally decomposable metallo-organic decomposition material.

Any other method of selectively heating the active layer such as using a heated stamper or embosser would also produce optically detectable spots. Also contemplated is any other source of energy which may function to effect an optically detectable change such as x-rays, electron beams, ion beams and the like. Sufficient energy needed to cause reduction of the metal ion is about 0.05 to about 100 nanojoules (njoules) per square micron ($\mu$m), preferably about 0.1 njoules to about 1.0 njoules per square $\mu$m.

In addition to the preferred embodiment i.e., reflective metallic state, other thermally induced changes in the chemical state of the metal ionic moiety that result in an optically detectable change are also contemplated. Such changes may include, for example, formation of oxides, hydroxides or carbonates; formation of precipitates from an otherwise homogeneous matrix; dissolution of metal or precipitates to form a homogeneous matrix; changes in the oxidation state of the metal other than to the zero valence state; ligand dissociation or association; and change in the physical phase or crystal structure of the active layer. In addition, other additives in addition to the dyes may also be combined in the active layer which may function to enhance the thermally induced changes.

In addition to optically detectable changes, the thermally induced changes in the metal component of the active layer can be in the form of metal lines which are electroconductive and are useful as interconnections in microelectronic circuitry. Thus, another preferred embodiment of the invention comprises an electroconductive medium.

In the following examples, a laser/optoelectronics system was used to write patterns of reflective spots onto prepared dye/thermally decomposable metallo-organic decomposition material films. The light source was an intensity modulated 30 mWatt GaAlAs semiconductor laser. The power source for the laser was a Dynascan 3300 or Hewlett Packard 8116 pulse generator which can supply up to 60 milliamps (mAmps) of current to the diode in a pulsed mode which can vary from 10 nsec pulses to continuous wave (CW) operation. The laser light output was collimated using a 0.40 numerical aperture collimating lens and directed through a Glan-Thompson prism. This linearly polarized light was passed through a quarter-wave-plate to form a circularly polarized light beam. The polarized light beam was then tightly focused and imaged onto the surface of the metallo-organic decomposition material film using a 0.60 numerical aperture objective lens. As the laser light was modulated, the thermally decomposable metallo-organic decomposition material sample was translated perpendicular to the path of the polarized light beam using a Newport 855 C linear translation system. In this manner a new area of the film was irradiated with each pulse of the laser.

A chemical change occurred in these films in the areas of irradiation through transfer of energy from the laser light via the absorbing dye intermediate to the thermally decomposable metallo-organic decomposition material. The chemical change resulted in a concurrent change in the optical properties of the films such that differentially reflective patterns were optically detectable from the surrounding unexposed areas. The data recorded in this manner was in the form of 1–5 micron sized spots. The spots were structurally analyzed by remote methods such as optical microscopy or scanning electron microscopy.

Means for optical analysis of the pattern of reflective spots were also employed. The optical means consisted of the above mentioned opto-electronic system operating in read mode. The power of the laser was lowered below a write threshold level to about 0.1 mWatts, the sample was passed under the focused beam of laser light and the intensity of the reflected light was monitored as a function of distance along the sample. The reflected light was split into two signals by a polarizing prism, one signal of which was directed onto a photodiode detector. The reflected light was converted to an electrical signal and processed by a computer system. In Example 1 the results were computer analyzed and displayed using commercial software (Stanford Research Corporation, San Francisco, Calif.) on an IBM Personal Computer. In the other examples another computer system was employed. The resulting display was a series of spikes which corresponded to changes in the reflectivity of the sample detected by the scanning laser beam.

EXAMPLE 1

A 20 percent by volume of solids in an aqueous suspension of copolymer derived from 5 weight percent diethyleneglycoldimethacrylate, 35 weight percent ethylacrylate, and 60 weight percent methacrylic acid, based on the weight of the copolymer, was neutralized with ammonium hydroxide. Silver nitrate was then added (5 weight percent based on the resulting weight of the silver salt of the copolymer) forming an ionomeric solution to which was added 0.1 grams of a Special Fast-Turquoise 8 GL dye solution (Mobay Chemical Corporation, Pittsburg, Pa.). The resulting ionomer/dye solution had a maximum absorption peak at 650 nm with a broad tail which extended past 830 nm. The solution was solvent cast onto a plate glass substrate and dried to form a uniform thin film constituting a recording medium according to the invention.

A diode laser recording/detection system as described above was used to record data onto the ionomer/dye film contained on the glass substrate. The data consisted of a pattern of reflective silver spots formed in the active layer ranging from about 2 to about 5 microns in major diameter. The spots were created with pulse durations of 1 msec at 12 mWatts of laser power. The playback signal was detected as an increase in the reflectivity when positioned over a written spot. Playback ratios were measured to be within acceptable carrier to noise limits. Optical mioroscopic analysis of these samples revealed evenly formed spots with a consistent distribution of metallic silver throughout the spot. A rim structure was observed surrounding each of the reflective spots.

On repeating the foregoing example substantially as described, but using any of the other ionomers described herein together with any suitable dye and light irradiation of an activating wavelength of similar proportion, similar results are obtained in the way of recording readable data.

EXAMPLE 2

Silver neodecanoate was prepared according to the procedure as disclosed in Armstrong, U.S. Pat. No. 4,555,501 herein incorporated by reference, from silver (I) oxide and neodecanoic acid. A slurry of 5 ml neodecanoic acid and 5 ml absolute ethanol was heated to 80° C. in an oil bath. Approximately 1.7 grams $Ag_2O$ was added slowly and the resulting solution was heated for approximately 5 minutes. One drop of 30 percent by weight $H_2O_2$ was added to the resulting solution to oxidize any prereduced silver metal. After the addition of $H_2O_2$ the solution was clear yellow. Absolute ethanol was added to the solution to precipitate white silver neodecanoate. The precipitate was filtered and reslurried twice in absolute ethanol. An amount of the dye, 3,3'-di(3-acetoxypropyl-11-diphenylamino-10,12-ethylene-5,5',6,6'-dibenzothiatricarbocyanine perchlorate) was added to a methylene chloride solution to provide a 0.01 molar solution. To this solution was added 1 weight percent silver neodecanoate and 1 weight percent polystyrene, based upon the weight of the solution. This solution was spin-coated onto a glass substrate to provide an active layer approximately 1 μm thick.

A diode laser recording system as described above was used to record data onto the active layer. The data consisted of a pattern of reflective silver spots formed in the active layer ranging from about 0.5 to about 5 microns in diameter. The spots were created with pulse durations of from about 300 msec to 10.4 msec at 30 mWatts of laser power. Optical microscopic analysis of these samples revealed evenly formed spots with a consistent distribution of metallic silver throughout the spot. A rim structure was observed surrounding each of the reflective spots.

EXAMPLE 3

Platinum 2-ethylhexanoate was synthesized by adding a slurry of 3 grams (g) of $K_2PtCl_4$ in 5 milliliters (ml) of deionized water to a solution of 2.3 ml of 2-ethylhexanoic acid, 2.0 ml of triethylamine, and 2.2 ml of water. This mixture was heated to 50° C. for two hours during which time a black oil separated from the mixture. The aqueous phase was decanted off, and the black oil was washed three times with water, then dissolved in $CH_2Cl_2$, and subsequently dried over 4 Å molecular sieve to remove residual water. The solvent was evaporated off to yield platinum 2-ethylhexanoate. A methylene chloride solution containing 1 weight percent Pt 2-ethylhexanoate and 0.5 weight percent of 3,3'-di(3-acetoxypropyl-11-diphenyl-amino-10,12-ethylene-5,5',6,6'-dibenzothiatricarbocyanine perchlorate), was prepared.

The solution was spin-coated onto a glass substrate using the methods as described in Example 2 to form an active layer. The active layer was then irradiated using a pulsed 30 mWatt diode laser as in the method of Example 1 to form 0.5 to 5 micron spots of reduced platinum. Optical microscopic analysis of these samples revealed evenly formed spots with a consistent distribution of metallic platinum throughout the spot. A rim structure was observed surrounding each of the reflective spots.

EXAMPLE 4

Ni and Cu neodecanoate compounds were separately prepared by forming a slurry of 2.5 ml of neodecanoic acid, 1 ml NaOH (50/50) and 30 ml of deionized water. A 30 ml aqueous solution of 0.02 eq. metal salt (either $Cu(NO_3)_2 \cdot 3H_2O$ or $NiCl_2 \cdot 6H_2O$) was added. Either solid Ni neodecanoate or an oil Cu neodecanoate formed and was separated from the aqueous phase. The solid was collected on a Whatman #1 filter and the oil was extracted with methylene chloride. A mixture of the dye employed in the previous examples and the Ni or Cu compound were then formed onto a glass substrate as described in the previous examples and were written on in the same manner. Optical microscopic analysis of these samples revealed spots which were less reflective than the surrounding medium.

EXAMPLE 5

Platinum 2-ethylhexanoate was prepared as set forth in Example 3 above except that one percent by weight of the methylene chloride solution also contained one percent by weight of polystyrene. A spin coated glass substrate was written on as in Example 3 producing micron spot of reduced platinum.

What is claimed is:

1. An article comprising a solid substrate having adhered to at least one surface thereof an active layer comprising a thermally decomposable metallo-organic decomposition material in active association with a photosensitive dye, said thermally decomposable metallo-organic decomposition material characterized in that when subjected to sufficient energy within the range of about 0.05 to about 100 nanojoules per square micron causes the metal ion at the location of the applied energy to be reduced to a form which is optically detectable on the surface of the substrate.

2. An optical memory medium comprising a solid substrate having adhered to at least one surface thereof an active layer comprising a thermally decomposable metallo-organic decomposition material in active association with a photosensitive dye, said thermally decomposable metallo-organic decomposition material characterized in that when subjected to sufficient energy within the range of about 0.05 to about 100 nanojoules per square micron causes the metal ion at the location of the applied energy to be reduced to a form which is optically detectable on the surface of the substrate.

3. An optical memory medium which comprises a substrate having at least one planar surface having adhered to at least one planar surface a film comprising a thermally decomposable metallo-organic decomposition material in active association with a photosensitive dye which has a maximum absorption peak within the wavelength range of 400 to 1100 nm and said thermally decomposable metallo-organic decomposable material is an organic compound containing a heteroatom selected from the group consisting of O, P, S or N which bridges a metal or metalloid cation selected from the group consisting o Cu, Ag, Au, Sn, Pb, In, Tl, Se, Te, Bi, Ni, Pd, Pt, Zn, Cd, Hg, Co, Rh, Ir, Fe, Ru, Os and mixtures thereof, to the organic portion of the compound, said thermally decomposable metallo-organic decomposition material characterized in that when subjected to sufficient energy within the range of about 0.05 to about 100 nanojoules per square micron causes the metal ion at the location of the applied energy to be reduced to a form which is optically detectable on the planar surface of the substrate.

4. The optical memory medium of claim 3 wherein the thermally decomposable metallo-organic compound is a compound corresponding to the formula

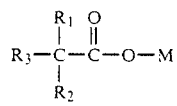

wherein $R_1$, $R_2$ and $R_3$ are independently H, an aliphatic group or an aromatic group wherein the total carbon content of $R_1$, $R_2$ and $R_3$ is from 2 to 14 carbon atoms and M is a metal or metalloid set forth in claim 3.

5. The optical memory medium of claim 3 wherein the thermally decomposable metallo-organic material is an ionomer.

6. The optical memory medium of claim 3 wherein the thermally decomposable metallo-organic material is an ionomer containing at least 2 percent of pendant groups selected from the group consisting of $-COO^{-1}$, $-SO_3^{-1}$, $-PO_3^{-2}$, $OPO_3^{-2}$ and combinations thereof.

7. The optical memory medium of claim 3 wherein the thermally decomposable metallo-organic decomposition material is a compound corresponding to the formula MXR wherein M is a metal or metalloid ion selected from the group set forth in claim 4, R is a thermally decomposable organic group containing from 2 to 20 carbon atoms selected from the group consisting of an amine, amide, mercaptide, alkoxide, or mono or dibasic carboxylic acid, and X is a bridging atom selected from the group consisting of O, P, S and N.

8. The optical memory medium of claim 7 wherein the R group is a carboxylic acid and M is selected from the group consisting of Cu, Ag, Au, Sn, Pb, Bi, Se, Te, Cd, Rh, Pd, Ir, Os, Pt and mixtures thereof.

9. The optical memory medium of claim 3 wherein the metal or metalloid is selected from the group consisting of Cu, Ag, Au, Sn, Pb, Bi, Se, Te, Cd, Rh, Pd, Ir, Os, Pt and mixtures thereof.

10. The optical memory medium of claims 3, 4, 5, 6, 7, 8, or 9 wherein the dye is selected from the group consisting of an oxoindolizine, naphthoquinone, cyanine and mixtures thereof.

11. The optical memory medium of claims 2, 3, 4, 5, 6, 7, 8 or 9 including a protective overcoat over said active layer.

* * * * *

UNITED STATES PATENT AND TRADEMARK OFFICE
CERTIFICATE OF CORRECTION

PATENT NO. : 4,994,352

DATED : February 19, 1991

INVENTOR(S) : Andrew J. G. Strandjord, et al.

It is certified that error appears in the above-identified patent and that said Letters Patent is hereby corrected as shown below:

On the title page: "ABSTRACT", first line, the word "perparation" should correctly appear as "preparation".

In Column 14, Line 3, "consisting o" should correctly appear as "consisting of".

In Column 14, Line 39, "Claim 4" should correctly appear as "Claim 3".

Signed and Sealed this

Sixteenth Day of February, 1993

Attest:

STEPHEN G. KUNIN

Attesting Officer

Acting Commissioner of Patents and Trademarks